(12) United States Patent
Murr et al.

(10) Patent No.: US 7,539,018 B2
(45) Date of Patent: May 26, 2009

(54) HEAT SINK RETAINING CLIP FOR AN ELECTRICAL CONNECTOR ASSEMBLY

(75) Inventors: Keith McQuilkin Murr, York, PA (US); Michael Eugene Shirk, Grantville, PA (US)

(73) Assignee: Tyco Electronics Corporation, Middletown, PA (US)

( * ) Notice: Subject to any disclaimer, the term of this patent is extended or adjusted under 35 U.S.C. 154(b) by 30 days.

(21) Appl. No.: 11/931,600

(22) Filed: Oct. 31, 2007

(65) Prior Publication Data

US 2009/0109627 A1     Apr. 30, 2009

(51) Int. Cl.
*H05K 7/20* (2006.01)
*F28F 7/00* (2006.01)
*G02B 6/36* (2006.01)
*H01R 13/00* (2006.01)

(52) U.S. Cl. .................. 361/704; 165/80.3; 165/185; 257/726; 257/727; 361/710; 361/719; 385/92; 439/372; 439/487

(58) Field of Classification Search ............... None
See application file for complete search history.

(56) References Cited

U.S. PATENT DOCUMENTS

| | | | |
|---|---|---|---|
| 6,135,793 A * | 10/2000 | Babineau | 439/92 |
| 6,517,382 B2 * | 2/2003 | Flickinger et al. | 439/607 |
| 6,788,540 B2 * | 9/2004 | Kruger et al. | 361/719 |
| 6,816,376 B2 * | 11/2004 | Bright et al. | 361/704 |
| 6,980,437 B2 | 12/2005 | Bright | |
| 7,296,937 B1 * | 11/2007 | Bright et al. | 385/92 |
| 7,317,617 B2 * | 1/2008 | Meadowcroft et al. | 361/715 |
| 7,457,126 B2 * | 11/2008 | Ahrens | 361/716 |
| 2003/0161108 A1 * | 8/2003 | Bright et al. | 361/707 |
| 2005/0195565 A1 * | 9/2005 | Bright | 361/688 |
| 2006/0291171 A1 * | 12/2006 | Ahrens | 361/716 |
| 2007/0183128 A1 * | 8/2007 | Pirillis et al. | 361/715 |
| 2007/0253168 A1 * | 11/2007 | Miller | 361/719 |

* cited by examiner

*Primary Examiner*—Gregory D Thompson

(57) ABSTRACT

An electrical connector assembly is provided that includes a guide frame having an internal compartment configured to receive an electrical component. The guide frame extends a length between a plug end portion having a plug opening and a rear end portion opposite the plug end portion. The guide frame includes a first wall that extends between the rear end portion and the plug end portion. The first wall includes a heat sink retention area that is configured to receive a heat sink. The rear end portion includes a rear wall. A clip is configured to be mounted on the guide frame. The clip is configured to extend over and engage at least a portion of the heat sink when the heat sink is received by the heat sink retention area. The clip is configured to engage the rear wall of the guide frame and extend along at least a portion of the first wall of the guide frame.

20 Claims, 8 Drawing Sheets

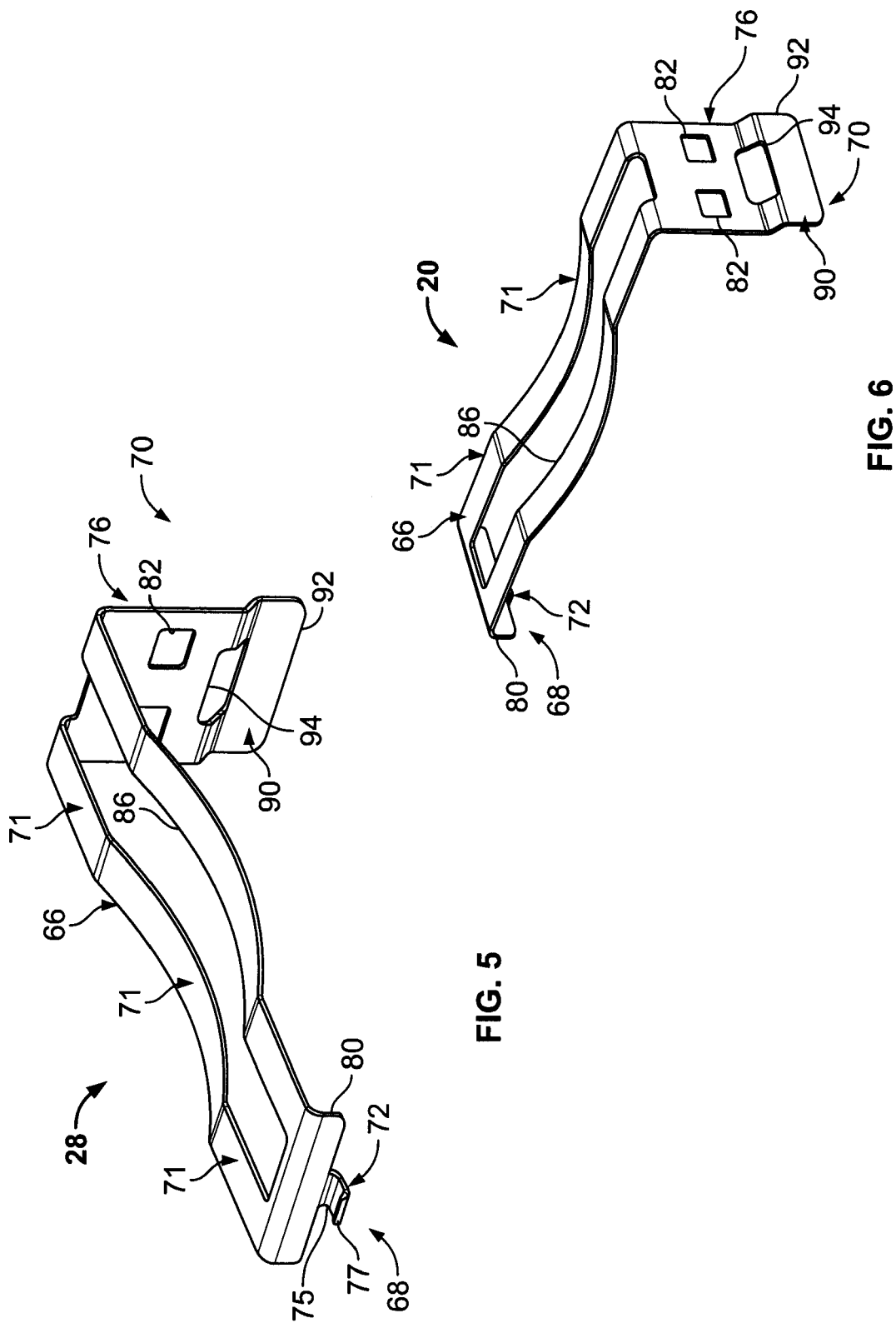

US 7,539,018 B2

HEAT SINK RETAINING CLIP FOR AN ELECTRICAL CONNECTOR ASSEMBLY

BACKGROUND OF THE INVENTION

The subject matter herein relates generally to electrical connector assemblies, and more particularly, to heat sink retaining clips for electrical connector assemblies for pluggable electronic modules.

Various types of fiber optic and copper based transceivers that permit communication between electronic host equipment and external devices are known. These transceivers may be incorporated into modules that can be pluggably connected to the host equipment to provide flexibility in system configuration. The modules are constructed according to various standards for size and compatibility, one standard being the Small Form-factor Pluggable (SFP) module standard.

The SFP module is plugged into a receptacle that is mounted on a circuit board within the host equipment. The receptacle includes an elongated guide frame, or cage, having a front that is open to an interior space, and an electrical connector disposed at a rear of the guide frame within the interior space. Both the connector and the guide frame are electrically and mechanically connected to the circuit board, and when an SFP module is plugged into a receptacle it is electrically and mechanically connected to the circuit board as well. Conventional SFP modules and receptacles perform satisfactorily carrying data signals at rates up to 2.5 gigabits per second (Gbs).

The next generation of SFP modules, sometimes referred to as the XFP standard, calls for the transceiver modules to carry data signals at rates up to 10 Gbs. Transceiver modules conforming to the XFP Standard and the surrounding circuitry may generate significantly greater quantities of heat to be removed in order for the electronic components to survive long term in comparison to previous module standards. Accordingly, some guide frames include a heat sink mounted over an opening in the guide frame. The heat sink has an engagement surface located proximate the interior cavity of the guide frame, and the engagement surface of the heat sink is configured to physically contact the electronic module when installed in the interior cavity of the guide frame. The heat sink dissipates heat generated in the module during operation thereof.

At least some known heat sinks are held on the guide frame using a clip that extends transversely over the heat sink and latches to side walls of the guide frame. Some known guide frames include more than one receptacle to accommodate interconnecting more than one electronic module to the host circuit board. A separate heat sink is sometimes provided on the guide frame for each of the electronic modules. However, known clips that latch to side walls of the guide frame do not provide separate clips for separate installation and/or removal of the different heat sinks from the assembly.

There is a need for an electrical connector assembly that is capable of separately holding a plurality of heat sinks on a guide frame.

BRIEF DESCRIPTION OF THE INVENTION

In one embodiment, an electrical connector assembly is provided that includes a guide frame having an internal compartment configured to receive an electrical component. The guide frame extends a length between a plug end portion having a plug opening and a rear end portion opposite the plug end portion. The guide frame includes a first wall that extends between the rear end portion and the plug end portion. The first wall includes a heat sink retention area that is configured to receive a heat sink. The rear end portion includes a rear wall. A clip is configured to be mounted on the guide frame. The clip is configured to extend over and engage at least a portion of the heat sink when the heat sink is received by the heat sink retention area. The clip is configured to engage the rear wall of the guide frame and extend along at least a portion of the first wall of the guide frame.

In another embodiment, an electrical connector assembly is provided. The electrical connector assembly includes a guide frame having an internal compartment configured to receive an electrical component. The guide frame extends a length between a plug end portion having a plug opening and a rear end portion opposite the plug end portion. The guide frame includes a first wall that extends between the rear end portion and the plug end portion. The rear end portion includes a rear wall. An electrical connector is at least partially held by the guide frame. The electrical connector is configured to electrically connect to the electrical component when the electrical component is received within the internal compartment. A heat sink is positioned along the first wall of the guide frame. A clip is mounted on the guide frame. The clip extends over and engages at least a portion of the heat sink. The clip engages the rear wall of the guide frame and extends along at least a portion of the first wall of the guide frame.

In another embodiment, an electrical connector assembly is provided that includes a guide frame having an internal compartment configured to receive an electrical component. The guide frame extends a length between a plug end portion having a plug opening and a rear end portion opposite the plug end portion. The guide frame includes a first wall that extends between the rear end portion and the plug end portion. A heat sink is positioned along the first wall of the guide frame. A clip is mounted on the guide frame. The clip extends over and engages at least a portion of the heat sink. The clip includes a latch element that latches to the first wall of the guide frame.

BRIEF DESCRIPTION OF THE DRAWINGS

FIG. 5 is a perspective view of an exemplary embodiment of a clip that may be used with the electrical connector assembly shown in FIGS. 1 and 2.

FIG. 6 is another perspective view of the clip shown in FIG. 5.

DETAILED DESCRIPTION OF THE INVENTION

Figure 1:
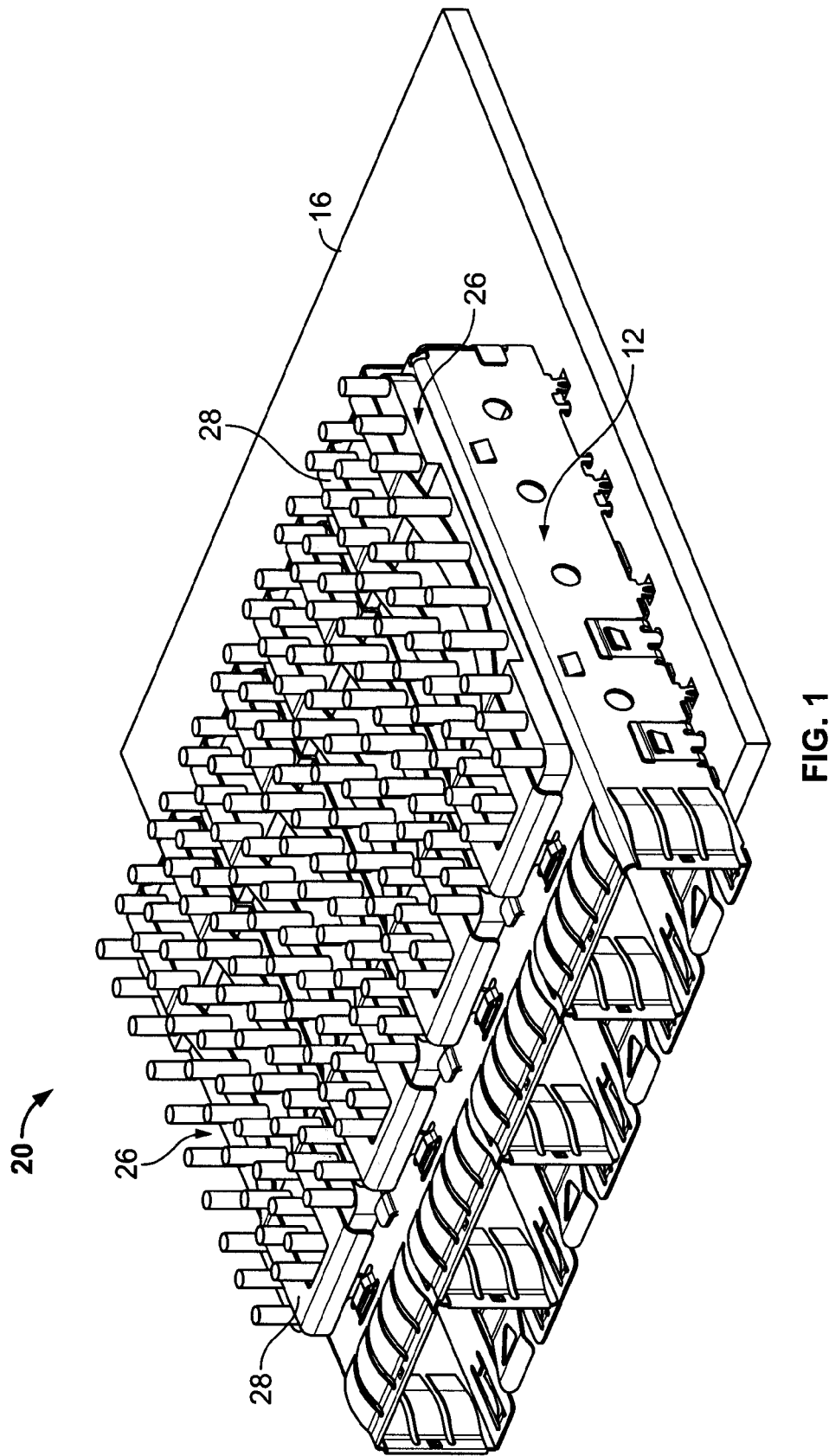
FIG. 1 is a perspective view of an exemplary embodiment of an electrical connector assembly.

FIG. 1 is a perspective view of an exemplary embodiment of an electrical connector assembly 10. The assembly 10 includes a shielded guide frame 12 having one or more electrical connectors 14 (FIGS. 4 and 8) positioned therein. The assembly 10 is configured to be positioned on a circuit board 16 for electrically connecting one or more pluggable electrical components 18 (FIGS. 9 and 10), such as, but not limited to, small form-factor pluggable (SFP) modules (including, but not limited to, XFP and QSFP modules), to the circuit board 16 via the electrical connector(s) 14. A plug end portion 20 of the guide frame 12 through which the pluggable electrical components 18 are installed into the assembly 10 is configured to be mounted, or received, within an opening of a panel (now shown) that is adjacent the circuit board 16. For example, the panel may be a wall of a housing of a device (not shown), such as, but not limited to, a computer, that includes the circuit board 16. In such an example, the electrical connector assembly 10 enables pluggable electrical component(s) 18 located outside the housing to be electrically connected to the circuit board 16 contained within the housing.

A plurality of heat sink assemblies 26 are mounted on the guide frame 12. Each heat sink assembly 26 is positioned to make physical contact with a corresponding pluggable electrical component 18 when the corresponding pluggable electrical component 18 is installed into the assembly 10. As will be described in more detail below, the assembly 10 includes a plurality of clips 28 that each extends over a corresponding one of the heat sink assemblies 26 for retaining the heat sink assemblies 26 on the guide frame 12.

Figure 2:
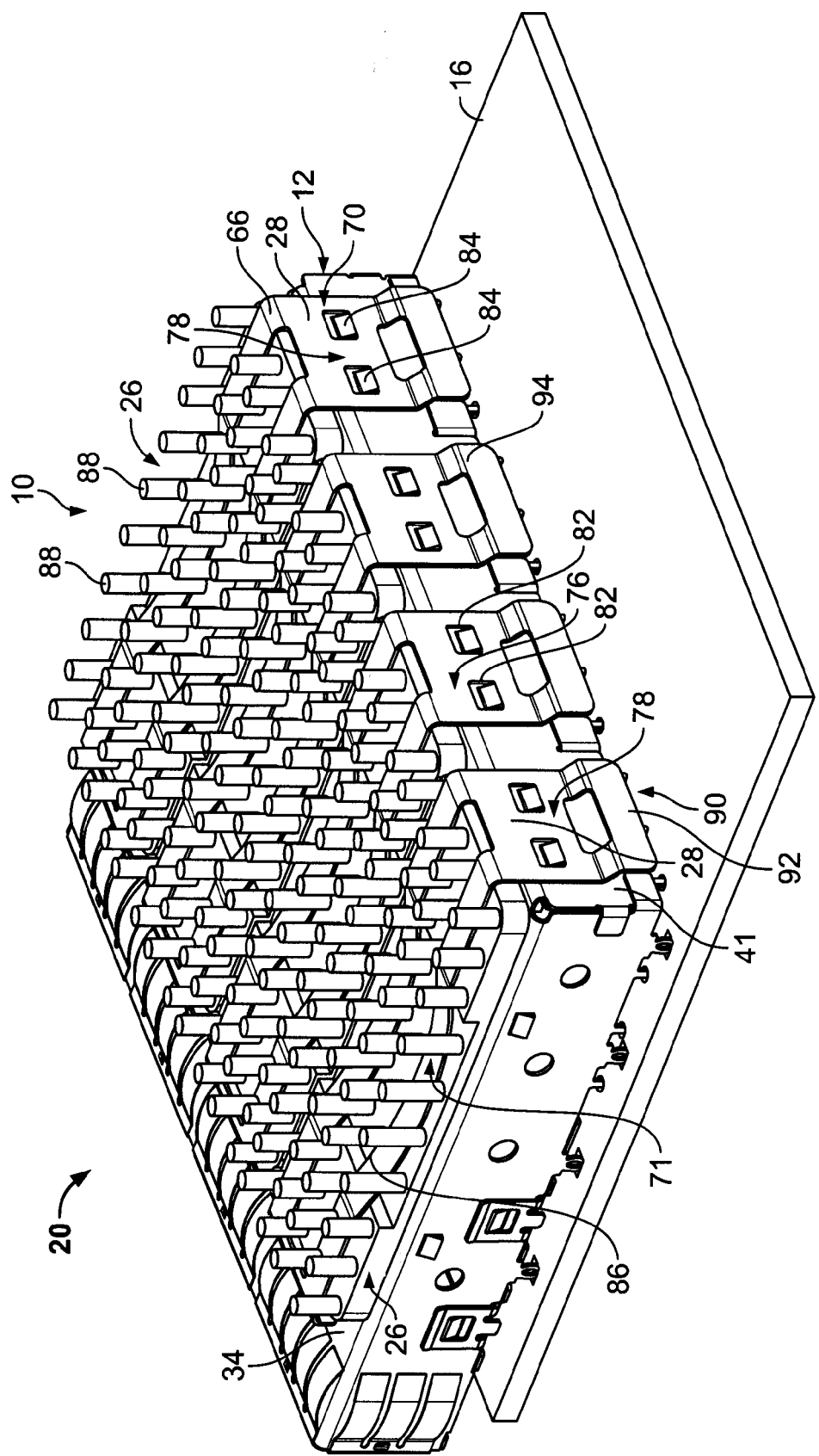
FIG. 2 is another perspective view of the electrical connector assembly shown in FIG. 1.
Figure 3:
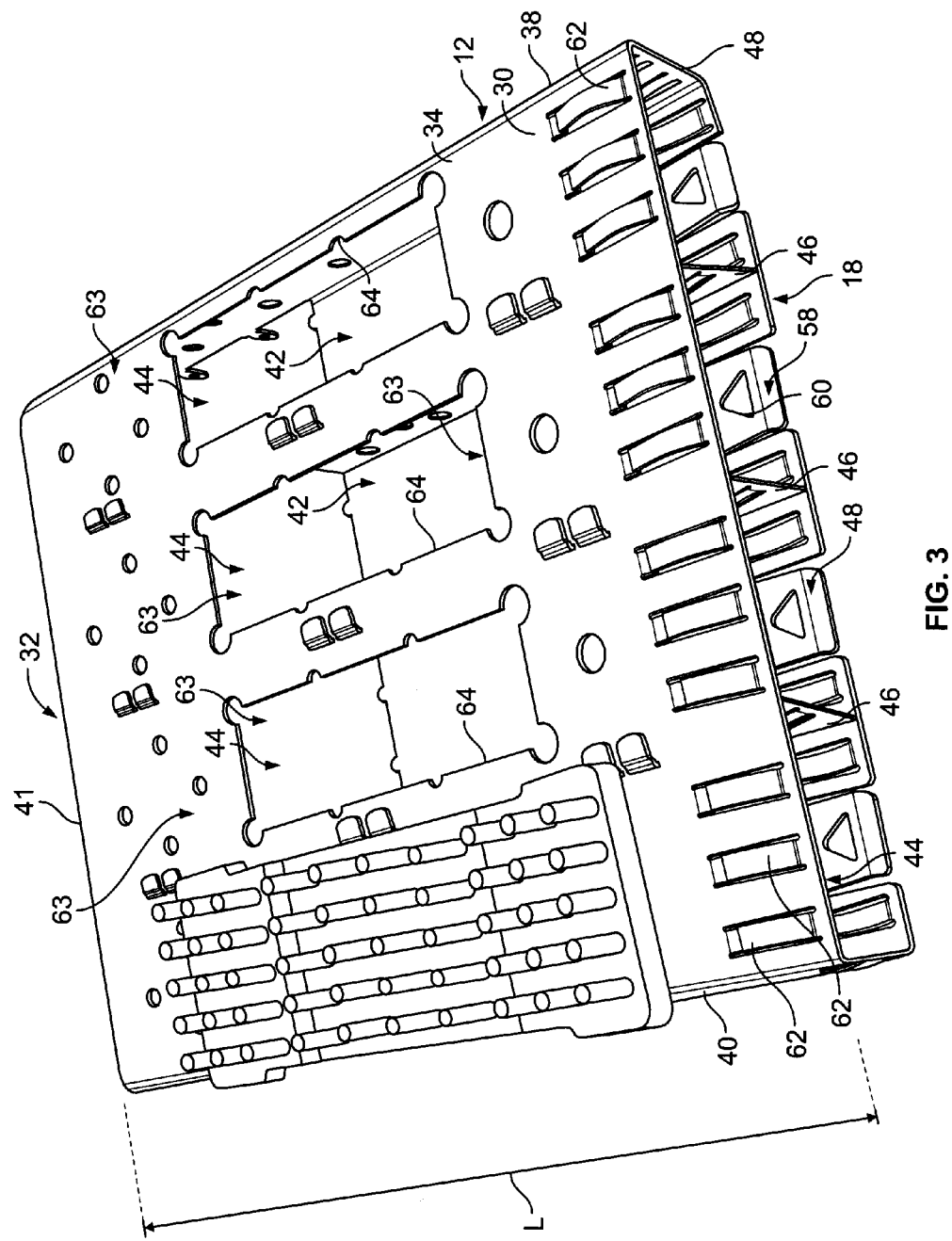
FIG. 3 is a perspective view of an exemplary embodiment of a guide frame of the electrical connector assembly shown in FIG. 1.
Figure 4:
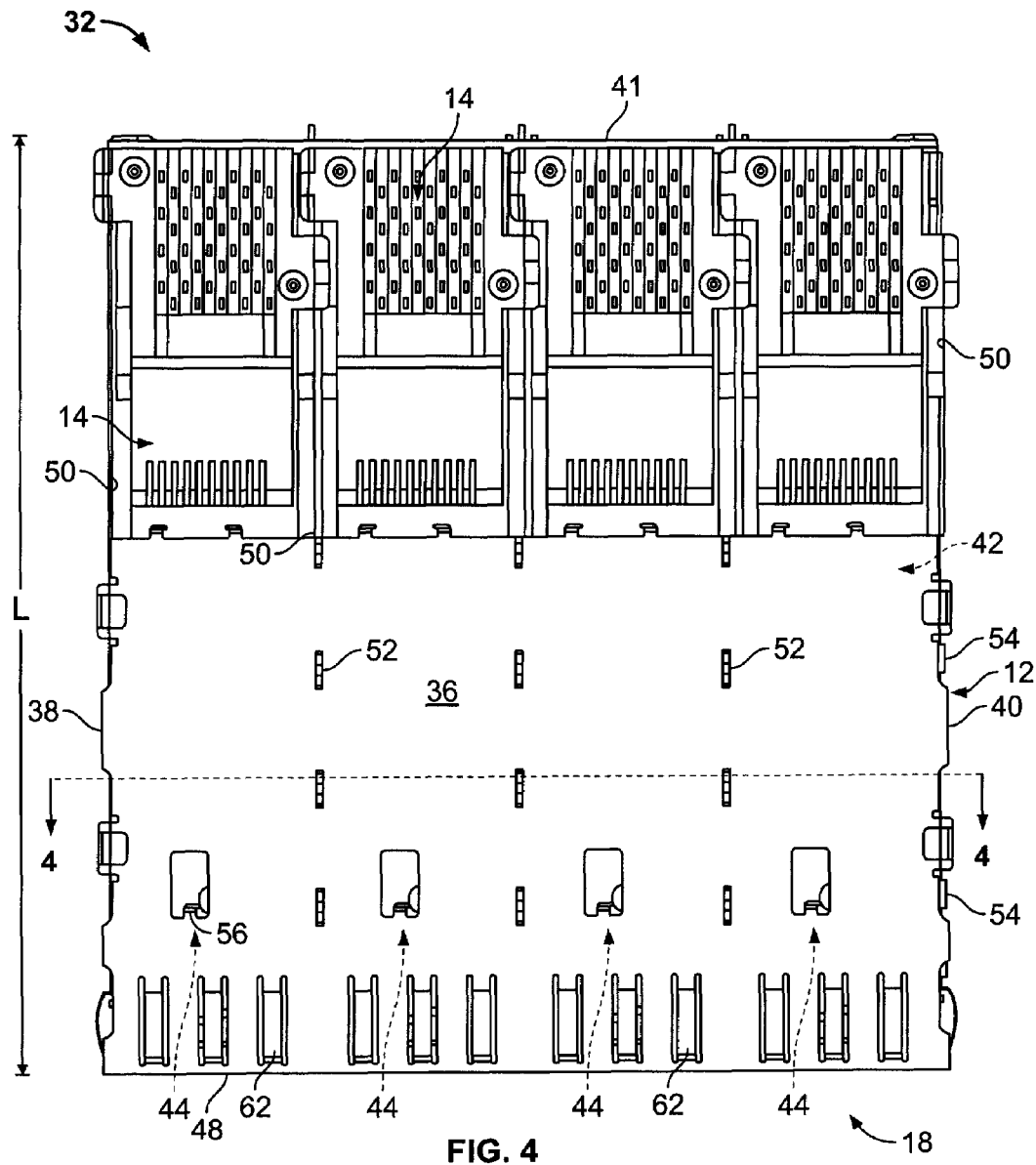
FIG. 4 is a bottom plan view of the guide frame shown in FIG. 3 illustrating a plurality of exemplary electrical connectors held thereby.

FIG. 3 is a perspective view of an exemplary embodiment of the guide frame 12. FIG. 4 is a bottom plan view of the guide member 12 illustrating the electrical connectors 14 held thereby. The guide frame 12 includes a body 30 extending a length L from the plug end portion 20 to an opposite rear end portion 32. In the illustrated embodiment, the guide frame body 30 includes a generally rectangular cross section, for example taken along line 4-4 of FIG. 4, and includes an upper wall 34, a lower wall 36, side walls 38 and 40, and a rear wall 41. However, the guide frame body 30 may include any suitable cross-sectional shape that enables the guide frame 12 to function as described herein. Any of the walls 34, 36, 38, and/or 40 may be referred to herein as a first wall. The guide frame 12 includes an internal chamber 42 that is subdivided into a plurality of internal compartments 44, which are arranged in a row. Specifically, in the illustrated embodiment, the guide frame 12 includes three divider walls 46 that divide the internal chamber 42 into four compartments 44. As will be discussed in more detail below, each internal compartment 44 is configured to at least partially receive a pluggable electrical component 18 (FIGS. 9 and 10) therein through a corresponding opening, or port, 48 at the plug end portion 18 that communicates with the corresponding compartment 44. For each internal compartment 44, the guide frame body 30 also includes an opening 50 extending through the lower wall 36. The openings 50 are adjacent the rear end portion 32 of the guide frame body 30 for at least partially receiving a corresponding one of the electrical connectors 14 within the internal chamber 42 of the guide frame 12. The openings 50 within the lower wall 36 of the guide frame body 30 also enable electrical connection between the electrical connectors 14 and the circuit board 16 (FIGS. 1 and 2).

Although the guide frame 12 is shown as including four internal compartments 44 arranged in a single row, the guide frame 12 may include any number of internal compartments 44, arranged in any number of rows and/or columns, for receiving any number of pluggable electrical components 18. In some embodiments, the guide frame 12 includes only one internal compartment 44 for receiving only one pluggable electrical component.

The guide frame 12 may optionally have features that ground the guide frame 12 to the circuit board 16, the panel, and/or another circuit board and/or panel. For example, the guide frame body 30 may include a plurality of printed circuit board tines 52 and/or 54, which may both mechanically hold and ground the guide frame body 30 to the circuit board 16. Additionally or alternatively, the guide frame body 30 may optionally include one or more resilient tongues 56 extending from the lower wall 36 to provide grounding of the guide frame body 30 to the circuit board 16. The upper and/or lower walls 34 and 36, respectively, may optionally include grounding tabs 58 for grounding a pluggable electrical component 18 that is received within the corresponding internal compartment 44. The grounding tabs 58 may optionally include latching openings 60. The guide frame body 30 may optionally include kick-out springs (not shown) to facilitate removing the electrical connectors 14 from the body 30.

The plug end portion 20 of the guide frame 12, which is held within the panel, may optionally include a plurality of springs 62 that extend circumferentially about the plug end portion 20 of the guide frame 12 and exert a spring force on an interior surface of the panel opening that receives the plug end portion 20 to securely hold the cage end within the panel opening. The springs 62 may also facilitate containing electromagnetic interference (EMI) emissions by providing a plurality of contact points that ground the guide frame to the panel.

The guide frame body 30 includes a plurality of heat sink retention areas 63 on the upper wall 34. In the illustrated embodiment, each heat sink retention area 63 includes a heat sink opening 64 that extends through the upper wall 34. However, one or more heat sink retention areas 63 may alternatively not include a heat sink opening 64 such that the heat sink assembly 26 received thereby physically contacts the upper wall 34 instead of the corresponding pluggable electrical component 18. In addition or alternative to the heat sink retention areas 63 on the upper wall 34, the guide frame body 30 may include one or more heat sink retention areas 63 (which may or may not each include a heat sink opening 64) on the lower wall 36, the side wall 38, and/or the side wall 40. As can be seen in FIGS. 1-4, each heat sink assembly 26 is mounted on the guide frame body 30 over a corresponding one of the openings 64 such that a bottom surface (not shown) of each heat sink assembly 26 is positioned to make physical contact with the corresponding pluggable electrical component 18 when the corresponding pluggable electrical component 18 is installed into the assembly 10. Although the openings 64 are shown as generally rectangular, the openings 64 may each have any suitable shape.

Figure 7:
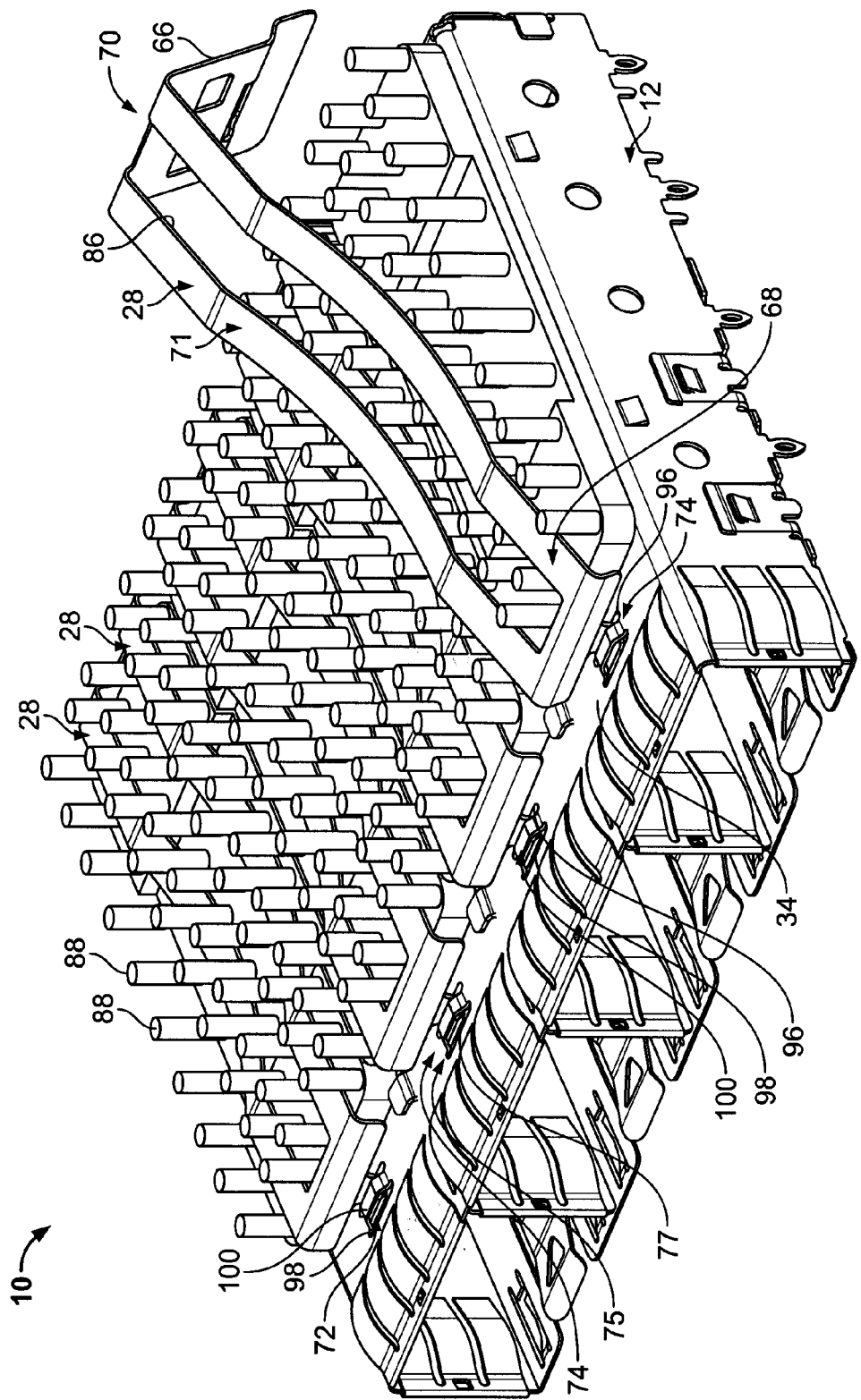
FIG. 7 is a partially exploded perspective view of the electrical connector assembly shown in FIG. 1.

FIGS. 5 and 6 are perspective views of an exemplary embodiment of a clip 28. The clip 28 includes a body 66 extending between a pair of opposite end portions 68 and 70. The clip body 66 may have any suitable size and/or shape that enables the clip body 66 to function as described herein. As can be seen in FIGS. 5 and 6, in the illustrated embodiment the clip body 66 includes a portion 71 extending between the end portions 68 and 70 that is shaped complementary to a portion 73 (FIG. 7) of the heat sink assembly 26 (FIGS. 1, 2, and 7). Moreover, the end portion 70 is angled with respect to the remainder of the clip body 66 to engage the rear wall 41 (FIGS. 2, 3, and 4) of the guide frame 12 (FIGS. 1-4 and 7).

The end portion 68 includes a latch element 72 that cooperates with a latch element 74 (FIG. 7) on the upper wall 34 (FIGS. 2, 3, and 7) of the guide frame 12. The end portion 70 includes a latch element 76 that cooperates with a latch element 78 (FIG. 2) on the rear wall 41 of the guide frame 12. Cooperation between the latch elements 72 and 74 and 76 and 78 to latch the clip 28 on the guide frame 12 will be described below in reference to FIGS. 2 and 7. The latch elements 72 and 76 may each have any suitable shape and each include any suitable structure that enables the latch elements 72 and 76 to latch the clip 28 to the guide frame 12. In the illustrated embodiment, the latch element 72 includes an extension 75 that extends outwardly from a flange 80 of the end portion 68 of the clip body 66 and includes a hook portion 77 on an end portion thereof. The hook portion 77 engages a portion of the upper wall 34 of the guide frame body 30. In the illustrated embodiment, the latch element 76 includes a pair of openings 82 that each receive a corresponding extension 84 (FIG. 2) of the latch element 78. Although two openings 82 are shown, the latch element 76 may include any number of openings 82 for receiving any number of extensions 84 of the latch element 78. Moreover, the openings 82 may have any suitable size and/or shape that enables the openings 82 to function as described herein.

The clip body 66 includes an optional opening 86 that extends through the clip body 66 to accommodate a plurality of cooling extensions 88 (FIGS. 2 and 7) of the heat sink assemblies 26, as will be described in more detail below. Although the opening 86 is shown as extending between the end portions 68 and 70, the opening 86 may extend along any portion of the clip body 66 that enables the opening 86 to function as described herein. Moreover, the opening 86 may have any suitable size and/or shape that enables the opening 86 to function as described herein.

The end portion 70 of the clip body 66 includes an optional release element 90 for removing the clip 28 from the guide frame 12. The release element 90 may have any suitable shape and may include any suitable structure that enables the release element 90 to function as described herein. In the illustrated embodiment, the release element 90 comprises a flange 92 and an opening 94. The flange 92 and the opening 94 may each have any suitable size and/or shape that enables the release element 90 to function as described herein. Operation of the release element 90 to remove the clip 28 from the guide frame 12 will be described below in reference to FIGS. 2 and 7.

FIG. 7 is a partially exploded perspective view of the electrical connector assembly 10. Referring now to FIGS. 2 and 7, each of the latch elements 74 on the upper wall 34 of the guide frame 12 may have any suitable shape and include any suitable structure that enables the latch elements 74 to function as described herein. In the illustrated embodiment, the latch elements 74 each include a pair of openings 96 and 98 that extend through the upper wall 34 of the guide frame 12 and are separated by a portion 100 of the upper wall 34. The latch element 72 is received within the opening 96 such that the hook portion 77 extends through the opening 98 and such that the hook portion 77 and other portions of the extension 75 engage the upper wall portion 100 to hold the end portion 68 of the clip 28 on the guide frame 12. Additionally or alternatively, each latch element 72 may include an opening (not shown) that cooperates with an extension (not shown) of the corresponding latch element 74. The upper wall portion 100 may optionally be raised from surrounding portions of the upper wall 34 to, for example, facilitate insertion and/or removal of the latch element 72 from the openings 96 and 98.

Each clip body 66 extends along the guide frame upper wall 34 over the corresponding heat sink assembly 26 such that the portion 71 that is shaped complementary with the heat sink assembly 26 engages the heat sink assembly 26. In the illustrated embodiment, each heat sink assembly 26 includes a pattern of the cooling extensions 88 that includes four spaced apart rows. The clip body 66 extends over the corresponding heat sink assembly 26 such that the clip body 66 extends between a pair of inner rows and the two opposite outer rows of the cooling extensions 88, and such that the cooling extensions 88 of the pair of inner rows extend through the opening 86. Although the pair of inner rows of cooling extensions 88 extend through the opening 86 in the illustrated embodiment, the opening 86 may be positioned and shaped to receive any of, any number, and/or any pattern of the cooling extensions 88.

The end portion 70 of each clip body 66 extends over and engages the rear wall 41 of the guide frame 12. Each of the latch elements 78 on the rear wall 41 of the guide frame 12 may have any suitable shape and include any suitable structure that enables the latch elements 78 to function as described herein. In the illustrated embodiment, the latch elements 78 each include the pair of extensions 84. The extensions 84 are received within a corresponding one of the openings 82 of the latch element 76 to hold the end portion 70 of the clip 28 on the guide frame 12. Additionally or alternatively, each latch element 78 may include an opening (not shown) that cooperates with an extension (not shown) of the corresponding latch element 76.

When the clips 28 are desired to be removed from the guide frame 12 to allow removal of the heat sink assemblies 26 from the guide frame, a user may grasp the flange 92 of the release element 90 and pull the end portion 70 of the clip 28 outwardly away from the guide frame rear wall 41 such that the extensions 84 are removed from the openings 82. The extension 75 can then be removed from the openings 96 and 98 of the guide frame upper wall 34 to dismount the clip 28 from the guide frame 12. The release element 90 can also be used in combination with a release tool (not shown) to remove the clips 28 from the guide frame 12. Specifically, an end of the release tool can be inserted between the flange 92 and the guide frame rear wall 41 and into the opening 94 for use as a lever to pull the end portion 70 outwardly away from the rear wall 41.

Although the heat sink assemblies 26 are illustrated and described herein as being mounted on the upper wall 34 of the guide frame 12, one or more of the heat sink assemblies 26 may alternatively be mounted on the side walls 38 and/or 40 of the guide frame 12. In such an embodiment wherein one or more of the heat sink assemblies 26 is mounted on the side walls 38 and/or 40, a portion of the corresponding clip body 66 may extend over the corresponding side wall 38 or 40.

Figure 8:
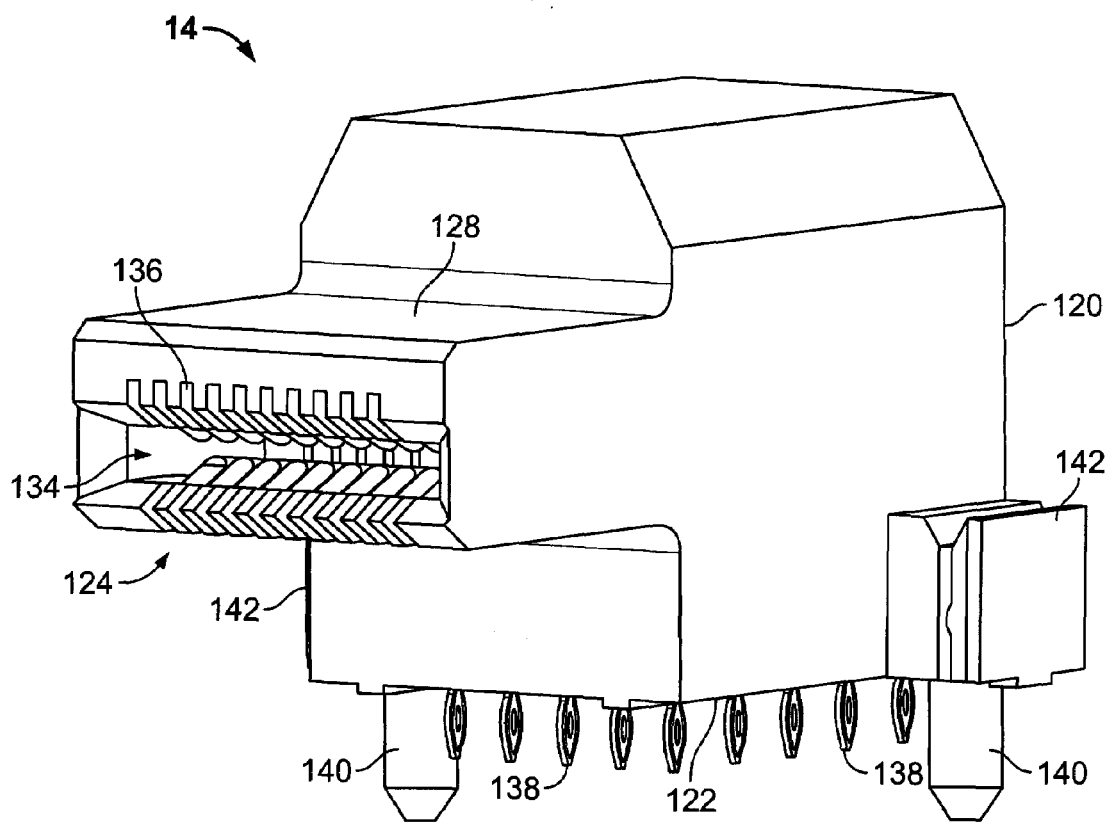
FIG. 8 is a perspective view of an exemplary electrical connector of the assembly shown in FIGS. 1, 2, and 7.

FIG. 8 is a perspective view of an electrical connector 14 formed in accordance with an embodiment of the present invention. The electrical connector 14 includes a housing 120 having a lower face 122 for mating with the circuit board 16 (FIGS. 1 and 2) and a mating face 124 for reception of a plug portion 126 (FIGS. 9 and 10) of the pluggable electrical component 18. Specifically, the mating face 124 includes an extension receptacle 128 that extends outwardly at the mating face 124. The extension receptacle 128 includes a terminal receptacle 134 that receives the plug portion 126 of the corresponding pluggable electrical component 18 therein. The terminal receptacle 134 includes one or more electrical contacts 136 that are electrically connected to corresponding electrical contacts 138 extending along the lower face 122 of the housing 120, such as, but not limited to, using electrical contacts (not shown) and/or circuit board traces (not shown) held within the housing 120. The electrical contacts 136 and 138 may each be any suitable type of electrical contact. The housing 120 may include alignment posts 140 and latching members 142 for aligning the electrical connector 14 within the guide frame 12 (FIGS. 1-4 and 7) and latching the electrical connector 14 in place within the guide frame 12, respectively.

The electrical connector 14 can be positioned within the guide frame 12 by inserting the connector 14 through the openings 50 (FIG. 4) within the guide frame lower wall 36 to the position shown in FIG. 4. In such a position, the lower face 122 of the housing 120 extends adjacent the opening 50 within the lower wall 36 of the guide frame 12 such that the electrical contacts 138 extend through the opening 50. When the guide frame 12 is positioned on the circuit board 16, the lower face 122 of the housing 120 engages the circuit board 16 such that the electrical contacts 138 extending along the lower face 122 of the housing 120 are electrically connected to the circuit board 16. Each of the electrical connectors 14 is shown latched to the guide frame 12, whereby the latches 142 are each latched to either a side wall 38 or 40 or a divider wall 46. When the electrical connectors 14 are latched in place within the guide frame 12, the terminal receptacle 134 is aligned for receipt of the plug portion 126 of the corresponding pluggable electrical component 18.

Figure 9:
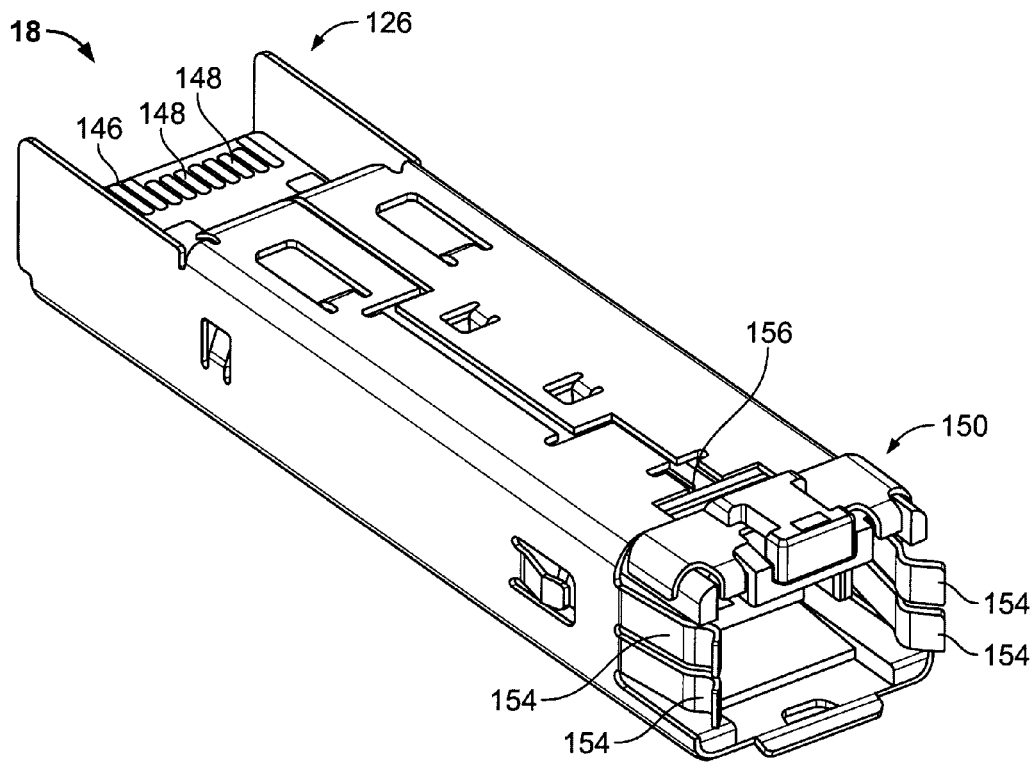
FIG. 9 is a perspective view an exemplary pluggable electrical component for the assembly shown in FIGS. 1, 2, and 7.
Figure 10:
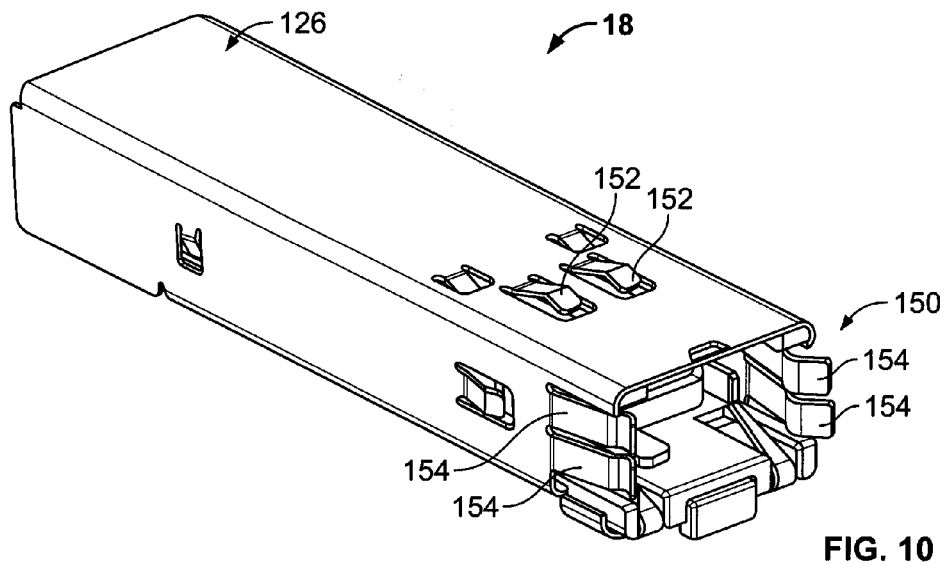
FIG. 10 is another perspective view of the pluggable electrical component shown in FIG. 9.

FIG. 9 is a perspective view of a pluggable electrical component 18 formed in accordance with an embodiment of the present invention. FIG. 10 is another perspective view of the pluggable electrical component 18. Although illustrated as a small form-factor pluggable (SFP) module, any suitable type of pluggable electrical component may be used with embodiments of the invention. The pluggable electrical component 18 includes the plug portion 126 for reception into the corresponding terminal receptacle 134 (FIG. 8) of the corresponding electrical connector 14 (FIGS. 4 and 8). In the exemplary embodiment, the plug portion 126 includes a circuit board 146 that is received within the corresponding terminal receptacle 134 such that electrical contacts 148 held on the circuit board 146 are electrically connected to the corresponding electrical contacts 136 of the corresponding terminal receptacle 134. As such, the pluggable electrical component 18 can be electrically connected to the circuit board 16 (FIGS. 1 and 2) via the corresponding electrical connector 14 held within the guide frame 12 (FIGS. 1-4 and 7). The electrical contacts 148 may each be any suitable type of electrical contact.

The pluggable electrical component 18 also includes an electrical interconnection to an interface (not shown) at an end portion 150 that is opposite the plug portion 126, such as, but not limited to, a copper interface in the way of a modular jack (not shown), or to a fiber optic connector (not shown) for further interfacing. The pluggable electrical component 18 may include grounding tabs 152 and/or 154 for grounding the pluggable electrical component 18 to the guide frame 12. A raised embossment 156 may also be provided for cooperation with the latching openings 60 (FIG. 4) of the guide frame 12 to facilitate latching the pluggable electrical component 18 in place within the guide frame 12.

The embodiments described and illustrated herein provide an electrical connector assembly that is capable of separately holding a plurality of heat sinks on a guide frame.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. The terms "upper", "lower", and "rear" refer to the orientation of the figures or the direction of components and are simply used for convenience of description. Moreover, the terms "first," "second," and "third," etc. in the claims are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

While the invention has been described in terms of various specific embodiments, those skilled in the art will recognize that the invention can be practiced with modification within the spirit and scope of the claims.

What is claimed is:

1. An electrical connector assembly comprising:
    a guide frame having an internal compartment configured to receive an electrical component, the guide frame extends a length between a plug end portion having a plug opening and a rear end portion opposite the plug end portion, the guide frame comprises a first wall that extends between the rear end portion and the plug end portion, the first wall comprising a heat sink retention area that is configured to receive a heat sink, wherein the rear end portion comprises a rear wall; and
    a clip configured to be mounted on the guide frame, the clip configured to extend over and engage at least a portion of the heat sink when the heat sink is received by the heat sink retention area, the clip configured to engage the rear wall of the guide frame and extend along at least a portion of the first wall of the guide frame.

2. The electrical connector assembly according to claim 1, wherein the clip comprises a latch element that is configured to latch to the rear wall of the guide frame.

3. The electrical connector assembly according to claim 1, wherein the clip comprises a latch element that is configured to latch to the rear wall of the guide frame, the latch element comprising an opening within the clip.

4. The electrical connector assembly according to claim 1, wherein the clip comprises a latch element that is configured to latch to the first wall of the guide frame.

5. The electrical connector assembly according to claim 1, wherein the clip comprises a latch element that is configured to latch to the first wall of the guide frame, the latch element comprising an extension.

6. The electrical connector assembly according to claim 1, wherein the clip extends between a first end portion and a second end portion that is opposite the first end portion, the first end portion comprising a latch element that is configured to latch to the first wall of the guide frame, the second end portion comprising a second latch element that is configured to latch to the rear wall of the guide frame.

7. The electrical connector assembly according to claim 1, wherein the clip comprises a release element that is configured to enable the clip to be removed from the guide frame.

8. The electrical connector assembly according to claim 1, wherein the clip comprises an opening extending through a body of the clip for receiving at least one cooling extension of the heat sink.

9. The electrical connector assembly according to claim 1, further comprising a heat sink received by the heat sink retention area, the clip extending over and engaging at least a portion of the heat sink, the clip engaging the rear wall of the guide frame and extending along at least a portion of the first wall of the guide frame.

10. The electrical connector assembly according to claim 1, wherein the heat sink retention area comprises an opening that extends through the first wall of the guide frame.

11. An electrical connector assembly comprising:
a guide frame having an internal compartment configured to receive an electrical component, the guide frame extends a length between a plug end portion having a plug opening and a rear end portion opposite the plug end portion, the guide frame comprises a first wall that extends between the rear end portion and the plug end portion, the rear end portion comprises a rear wall;
an electrical connector at least partially held by the guide frame, the electrical connector configured to electrically connect to the electrical component when the electrical component is received within the internal compartment;
a heat sink positioned along the first wall of the guide frame; and
a clip mounted on the guide frame, the clip extending over and engaging at least a portion of the heat sink, the clip engaging the rear wall of the guide frame and extending along at least a portion of the first wall of the guide frame.

12. The electrical connector assembly according to claim 11, wherein the clip comprises a latch element that latches to the rear wall of the guide frame.

13. The electrical connector assembly according to claim 11, wherein the clip comprises a latch element that latches to the rear wall of the guide frame, the latch element comprising an opening within the clip.

14. The electrical connector assembly according to claim 11, wherein the clip comprises a latch element that latches to the first wall of the guide frame.

15. The electrical connector assembly according to claim 11, wherein the clip comprises a latch element that latches to the first wall of the guide frame, the latch element comprising an extension.

16. The electrical connector assembly according to claim 11, wherein the clip extends between a first end portion and a second end portion that is opposite the first end portion, the first end portion comprising a latch element that latches to the first wall of the guide frame, the second end portion comprising a second latch element that latches to the rear wall of the guide frame.

17. The electrical connector assembly according to claim 11, wherein the clip comprises a release element that is configured to enable the clip to be removed from the guide frame.

18. The electrical connector assembly according to claim 11, wherein the clip comprises an opening extending through a body of the clip for receiving at least one cooling extension of the heat sink.

19. An electrical connector assembly comprising:
a guide frame having an internal compartment configured to receive an electrical component, the guide frame extends a length between a plug end portion having a plug opening and a rear end portion opposite the plug end portion, the guide frame comprises a first wall that extends between the rear end portion and the plug end portion;
a heat sink positioned along the first wall of the guide frame;
a clip mounted on the guide frame, the clip extending over and engaging at least a portion of the heat sink, the clip comprising a latch element that latches to the first wall of the guide frame.

20. The electrical connector assembly according to claim 19, wherein the rear end portion of the guide frame comprises a rear wall, the clip comprising a latch element that latches to the rear wall of the guide frame.

* * * * *